(12) United States Patent
Chen

(10) Patent No.: US 10,770,534 B2
(45) Date of Patent: Sep. 8, 2020

(54) ACTIVE MATRIX ORGANIC LIGHT-EMITTING DIODE DISPLAY PANEL

(71) Applicant: Wuhan China Star Optoelectronics Semiconductor Display Technology Co., Ltd., Wuhan (CN)

(72) Inventor: Caiqin Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 71 days.

(21) Appl. No.: 16/325,399

(22) PCT Filed: Oct. 12, 2018

(86) PCT No.: PCT/CN2018/110074
§ 371 (c)(1),
(2) Date: Feb. 14, 2019

(87) PCT Pub. No.: WO2019/227818
PCT Pub. Date: Dec. 5, 2019

(65) Prior Publication Data
US 2020/0127072 A1    Apr. 23, 2020

(30) Foreign Application Priority Data
May 30, 2018 (CN) .......................... 2018 1 0539035

(51) Int. Cl.
| H01L 33/00 | (2010.01) |
| H01L 21/00 | (2006.01) |
| H01L 27/32 | (2006.01) |

(52) U.S. Cl.
CPC ...... *H01L 27/3276* (2013.01); *H01L 27/3246* (2013.01)

(58) Field of Classification Search
CPC .................. H01L 51/5209; H01L 51/5215
USPC ........................................ 438/29, 69; 257/98
See application file for complete search history.

(56) References Cited

U.S. PATENT DOCUMENTS

| 7,173,373 | B2* | 2/2007 | Yamada | H01L 51/5228 |
| | | | | 313/498 |
| 8,883,531 | B2* | 11/2014 | Kim | H01L 27/3244 |
| 9,989,798 | B2* | 6/2018 | Kim | G02F 1/1334 |
| 10,229,959 | B2* | 3/2019 | Abe | H01L 27/3272 |
| 10,553,805 | B2* | 2/2020 | Maeda | H01L 51/5221 |
| 2018/0097020 | A1 | 4/2018 | Lv et al. | |

FOREIGN PATENT DOCUMENTS

| CN | 103280501 | 9/2013 |
| CN | 104752344 | 7/2015 |
| CN | 105225976 | 1/2016 |
| CN | 106057824 | 10/2016 |

* cited by examiner

*Primary Examiner* — Calvin Lee

(57) ABSTRACT

An active matrix organic light-emitting diode display panel is provided and includes a first metal layer, an interlayer dielectric layer, a second metal layer, a planarization layer and a transparent conductive layer sequentially located on a substrate. Second via holes are defined in the planarization layer. The transparent conductive layer is connected to the second metal layer through the second via holes. A contact surface of the second metal layer and the transparent conductive layer is a waved surface.

18 Claims, 3 Drawing Sheets

ACTIVE MATRIX ORGANIC LIGHT-EMITTING DIODE DISPLAY PANEL

RELATED APPLICATIONS

This application is a National Phase of PCT Patent Application No. PCT/CN2018/110074 having International filing date of Oct. 12, 2018, which claims the benefit of priority of Chinese Patent Application No. 201810539035.0 filed on May 30, 2018. The contents of the above applications are all incorporated by reference as if fully set forth herein in their entirety.

FIELD AND BACKGROUND OF THE INVENTION

The present invention relates to a field of display technology, and especially to an active matrix organic light-emitting diode display panel.

In an active matrix organic light-emitting diode (AMO-LED) display panel, an anode is usually made of a structure of three layers of indium tin oxide (ITO), Ag and ITO. Because ITO includes excellent conductivity and light transmittance and characteristics of high work function, adding ITO with high work function between Ag and highest occupied molecular orbital (HOMO) of an OLED improves efficiency of hole mobility.

Furthermore, characteristics of high work function of ITO can also mitigate contact impedance between source/drain metal and IC/FPC contacts. ITO, in addition to characteristics of high work, also has better chemical stability. An ITO film, after the acid and alkali resistance tests, is proved to be able to endure water corrosion.

With respect to an AMOLED display panel, in addition to anodes in a displaying region, integrated circuit (IC) pads, flexible printed circuit (FPC) pads, array full contact testing pads, cell testing pads in a non-displaying region also need to be covered with ITO to prevent the display panel from corrosion by the high temperature and high humidity process and environmental acid/alkali during later OLED and module forming processes, after completion of an array source/drain metal forming process. As shown in FIG. 1, a soldering region (pad) in the above mentioned non-displaying region includes a substrate 11, a buffer layer 12, a first insulating layer 13, a first metal layer 14, a second insulating layer 15, an interlayer dielectric layer 16, a second metal layer 17, a planarization layer 18, a transparent conductive layer 19 and a pixel definition layer 20.

However, the ITO on the pad in the non-displaying region is easily to be peeled to be separated therefrom, thereby causing contact failure between the IC/FPC or COF and the panel. A conventional design is to omit the design of the ITO in the pad region; that is to omit the transparent conductive layer 19 shown in FIG. 1. Such a practice causes the metal layer to be corroded easily and lowers connection stability of the pad and lifespan of the display panel.

Therefore, it is necessary to provide an active matrix organic light-emitting diode display panel, to solve the issue of the conventional technology.

SUMMARY OF THE INVENTION

An objective of the present invention is to provide an active matrix organic light-emitting diode display panel to increase connection stability of the display panel.

The solve the above technical issue, the present invention provides an active matrix organic light-emitting diode display panel, comprising:

a first metal layer and an interlayer dielectric layer sequentially disposed on a substrate; wherein two or more first via holes are defined in the interlayer dielectric layer at intervals, and the first metal layer is connected to a portion of a second metal layer through the first via holes;

the second metal layer covering the first via holes;

a planarization layer located on the second metal layer, and second via holes defined in the planarization layer;

the transparent conductive layer covering the second via holes and located on a portion of the planarization layer, the transparent conductive layer connected to the second metal layer through the second via holes; wherein a contact surface of the second metal layer and the transparent conductive layer is a waved surface; and a pixel definition layer located on the transparent conductive layer and located on a portion of planarization layer that is not covered by the transparent conductive layer.

In the active matrix organic light-emitting diode display panel of the present invention, the active matrix organic light-emitting diode display panel further comprises:

a first insulating layer located between the substrate and the first metal layer; and at least one third via hole defined in the first metal layer, and the first insulating layer is connected to a portion of the second metal layer through the at least one third via hole.

In the active matrix organic light-emitting diode display panel of the present invention, the second metal layer covers the at least one third via hole and the first via holes.

In the active matrix organic light-emitting diode display panel of the present invention, at least one fourth via hole is defined in the second metal layer, and a portion of the transparent conductive layer is connected to a portion of the first metal layer through the at least one fourth via hole; and the transparent conductive layer covers the second via holes and the at least one fourth via hole, and is located on the planarization layer.

In the active matrix organic light-emitting diode display panel of the present invention, the transparent conductive layer covers a portion of the second metal layer at a corresponding interval, and the portion of the second metal layer at the corresponding interval is the portion of the second metal layer on a portion of the interlayer dielectric layer on an adjacent portion between adjacent two of the first via holes.

In the active matrix organic light-emitting diode display panel of the present invention, the pixel definition layer covers the transparent conductive layer, a portion of the second metal layer not covered by the transparent conductive layer and a portion of the planarization layer not covered by the transparent conductive layer.

In the active matrix organic light-emitting diode display panel of the present invention, the transparent conductive layer fully covers a portion of the second metal layer at a corresponding interval, and the portion of the second metal layer at the corresponding interval is the portion of the second metal layer on a portion of the interlayer dielectric layer on an adjacent portion of adjacent two of the first via holes.

In the active matrix organic light-emitting diode display panel of the present invention, the active matrix organic light-emitting diode display panel further comprises:

a buffer layer located between the substrate and the first metal layer;

a first insulating layer located between the buffer layer and the first metal layer; and a second insulating layer located between the first metal layer and the interlayer dielectric layer.

The present invention provides an active matrix organic light-emitting diode display panel, comprising:

a first metal layer and an interlayer dielectric layer sequentially disposed on a substrate; wherein a first via hole is defined in the interlayer dielectric layer, and the first metal layer is connected to a portion of a second metal layer through the first via hole;

the second metal layer covering the first via hole;

a planarization layer located on the second metal layer, and a second via hole defined in the planarization layer; and the transparent conductive layer covering the second via hole and located on a portion of the planarization layer, the transparent conductive layer connected to the second metal layer through the second via hole; wherein a contact surface of the second metal layer and the transparent conductive layer is a rugged surface.

In the active matrix organic light-emitting diode display panel of the present invention, the active matrix organic light-emitting diode display panel further comprises:

a first insulating layer located between the substrate and the first metal layer; and at least one third via hole defined in the first metal layer, wherein the first insulating layer is connected to a portion of the second metal layer through the at least one third via hole.

In the active matrix organic light-emitting diode display panel of the present invention, the second metal layer covers the at least one third via hole and the first via hole.

In the active matrix organic light-emitting diode display panel of the present invention, at least one fourth via hole is defined in the second metal layer, and a portion of the transparent conductive layer is connected to a portion of the first metal layer through the at least one fourth via hole; and the transparent conductive layer, covers the second via hole and the at least one fourth via hole, and is located on the planarization layer.

In the active matrix organic light-emitting diode display panel of the present invention, the active matrix organic light-emitting diode display panel further comprises:

a pixel definition layer located on the transparent conductive layer and a portion of the planarization layer not covered by the transparent conductive layer.

In the active matrix organic light-emitting diode display panel of the present invention, two or more first via holes are defined in the interlayer dielectric layer at intervals.

In the active matrix organic light-emitting diode display panel of the present invention, the transparent conductive layer covers a portion of the second metal layer at a corresponding interval, and the portion of the second metal layer at the corresponding interval is the portion of the second metal layer on a portion of the interlayer dielectric layer on an adjacent portion between adjacent two of the first via holes.

In the active matrix organic light-emitting diode display panel of the present invention, the pixel definition layer covers the transparent conductive layer, a portion of the second metal layer not covered by the transparent conductive layer and a portion of the planarization layer not covered by the transparent conductive layer.

In the active matrix organic light-emitting diode display panel of the present invention, the transparent conductive layer fully covers the second metal layer at the corresponding interval, and the portion of the second metal layer at the corresponding interval is the portion of the second metal layer on a portion of the interlayer dielectric layer on an adjacent portion between adjacent two of the first via holes.

In the active matrix organic light-emitting diode display panel of the present invention, the active matrix organic light-emitting diode display panel further comprises:

a buffer layer located between the substrate and the first metal layer;

a first insulating layer located between the buffer layer and the first metal layer; and a second insulating layer located between the first metal layer and the interlayer dielectric layer.

The active matrix organic light-emitting diode display panel of the present invention, by increasing roughness of a contact surface between the second metal layer and the transparent conductive layer, prevents transparent conductive layer from shedding, prevents the metal layer from corrosion, and increases connection stability and lifespan of the display panel.

DESCRIPTION OF SPECIFIC EMBODIMENTS OF THE INVENTION

Figure 1:
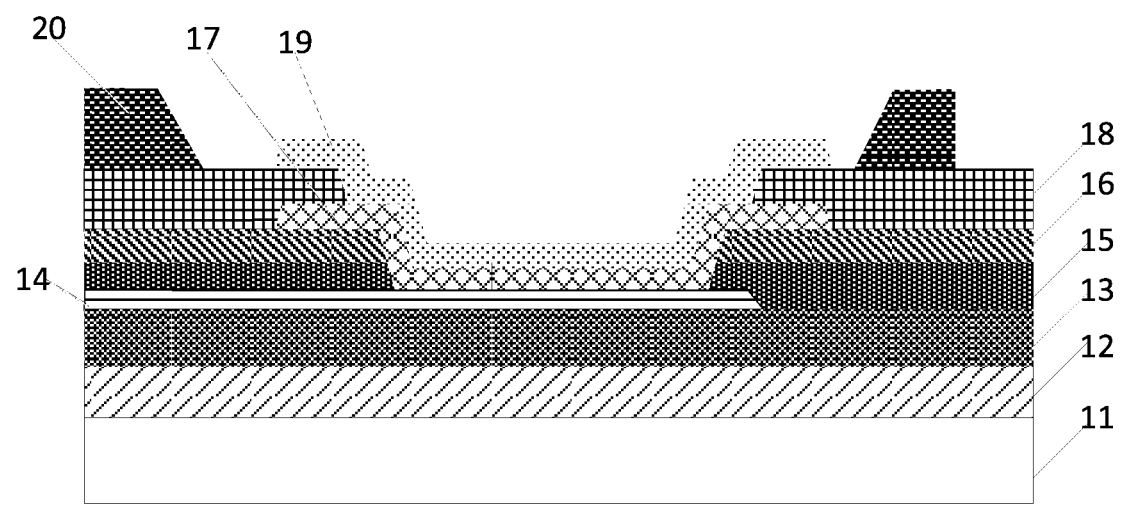
FIG. 1 is a structural schematic view of a non-displaying region soldering region of a conventional active matrix organic light-emitting diode (AMOLED)

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention. In the figures, units with similar structures are marked with the same reference numerals.

Figure 2:
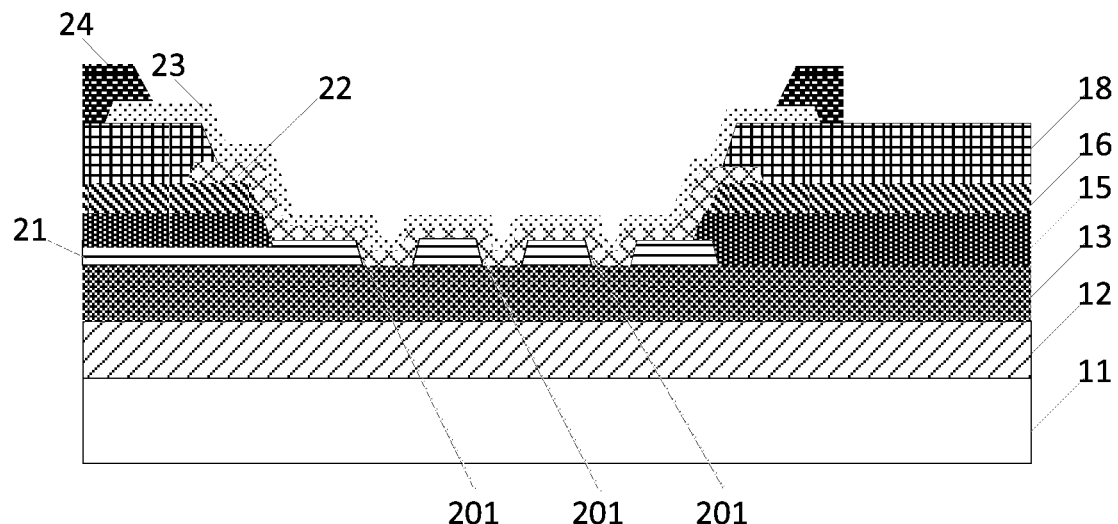
FIG. 2 is a structural schematic view of a first embodiment of an AMOLED display panel of the present invention.

With reference to FIG. 2, FIG. 2 is a structural schematic view of a first embodiment of an active matrix organic light-emitting diode display panel (AMOLED) display panel of the present invention.

As shown in FIG. 2, a structural schematic view of the active matrix organic light-emitting diode display panel in a non-displaying region of is given. The active matrix organic light-emitting diode display panel of the present embodiment includes: a substrate 11, a buffer layer 12, a first insulating layer 13, a first metal layer 21, a second insulating layer 15, an interlayer dielectric layer 16, a second metal layer 22, a planarization layer 18, a transparent conductive layer 23 and a pixel definition layer 24.

The buffer layer 12 and the first insulating layer 13 are sequentially located on the substrate 11.

The first metal layer 21 is located on the first insulating layer 13. Three third via holes 201 are defined in the first metal layer 21. The first insulating layer 13 is connected to a portion of the second metal layer 22 through the third via holes 201. It is understood that a number of the third via holes 201 can be one, two, three or more.

The second insulating layer 15 is located on the first metal layer 21.

The interlayer dielectric layer 16 is located on the second insulating layer 15. First via holes (not shown in figures) are defined in the interlayer dielectric layer 16. The first metal layer 21 is connected to a portion of the second metal layer 22 through the first via holes.

The second metal layer 22 covers the first via holes and is located on the interlayer dielectric layer 16. The second metal layer 22 also covers the third via holes 201. A width of the first via hole (the width between left and right portions of the interlayer dielectric layer) is greater than a sum of widths of all the third via holes 201.

The planarization layer 18 is located on the second metal layer 22. Second via holes (not shown in figures) are defined in the planarization layer 18. The second metal layer 22 is connected to transparent conductive layer 23 through the second via holes.

The transparent conductive layer 23 covers the second via holes and is located a portion of the planarization layer 18.

With reference FIG. 2, it is apparent that a contact surface between the second metal layer 22 and the transparent conductive layer 23 is a rugged surface, and roughness of the contact surface between the second metal layer 22 and the transparent conductive layer 23 is increased to prevent the transparent conductive layer from separating and to increase electrical connection stability of the active matrix organic light-emitting diode display panel. Furthermore, corrosion of the metal layer is prevented and lifespan of the display panel is improved.

The pixel definition layer 24 is located on the planarization layer 18. It is understood that the pixel definition layer 24 can only cover the planarization layer 18.

Preferably, the pixel definition layer 24 can be located on the transparent conductive layer 23 and on a planarization layer 18 that is not covered by the transparent conductive layer. Because a periphery of the transparent conductive layer 23 is covered by the pixel definition layer 24, therefore the transparent conductive layer is prevented from separating.

Figure 3:
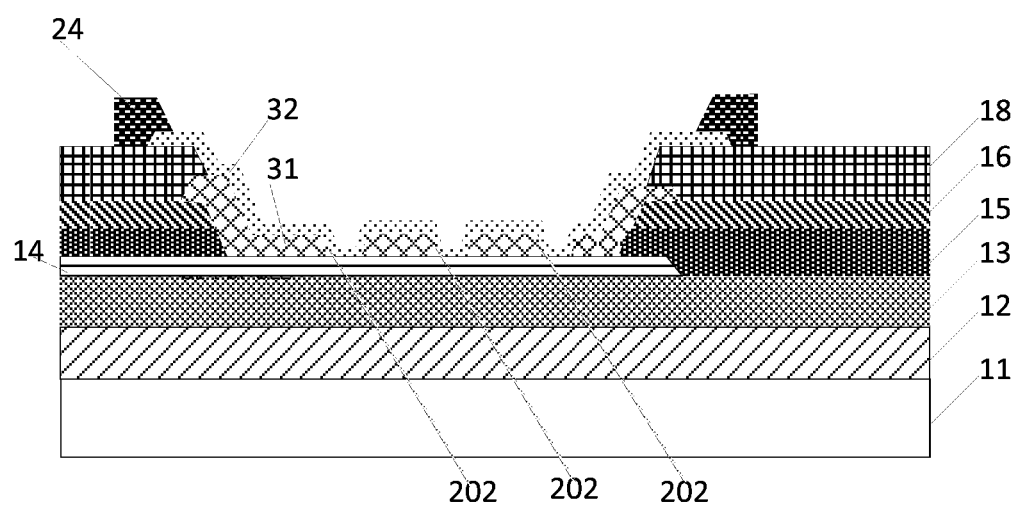
FIG. 3 is a structural schematic view of a second embodiment of the AMOLED display panel of the present invention.

With reference to FIG. 3, FIG. 3 is a structural schematic view of the AMOLED display panel of the present invention second embodiment.

As shown in FIG. 3, a structural schematic view of the active matrix organic light-emitting diode display panel in the non-displaying region is given. The active matrix organic light-emitting diode display panel of the present embodiment includes: a substrate 11, a buffer layer 12, a first insulating layer 13, a first metal layer 14, a second insulating layer 15, an interlayer dielectric layer 16, a second metal layer 31, planarization layer 18, a transparent conductive layer 32 and a pixel definition layer 24.

The buffer layer 12 and the first insulating layer 13 are sequentially located on the substrate 11.

The first metal layer 14 is located on the first insulating layer 13.

The second insulating layer 15 is located on the first metal layer 14.

The interlayer dielectric layer 16 is located on the second insulating layer 15. First via holes (not shown in figures) are defined in the interlayer dielectric layer 16. The first metal layer 31 is connected to the second metal layer 22 through the first via holes.

The second metal layer 31 covers the first via holes and is located on the interlayer dielectric layer 16. Three fourth via holes 202 are defined in the second metal layer 31. A portion of the transparent conductive layer 32 is connected to a portion of the first metal layer 14 through the fourth via holes 202. It is understood that a number of the fourth via holes 202 can be one, two, three or more. A width of the first via hole is greater than a sum of widths of all the fourth via holes 202.

The planarization layer 18 is located on the second metal layer 31. Second via holes (not shown in figures) are defined in the planarization layer 18. The second metal layer 22 is connected to the transparent conductive layer 32 through the second via holes.

The transparent conductive layer 32 covers the second via hole, the fourth via holes 202 and is located on the planarization layer 18.

With reference to FIG. 3, it is apparent that a contact surface between the second metal layer 31 and the transparent conductive layer 32 is also a rugged surface. Roughness of the contact surface between the second metal layer 31 and the transparent conductive layer 32 to prevent the transparent conductive layer from separating and to increase electrical connection stability of the active matrix organic light-emitting diode display panel. Furthermore, corrosion of the metal layer is prevented and lifespan of the display panel is improved The pixel definition layer 24 is located on the planarization layer 18. Of course, it is understood that the pixel definition layer 24 can only cover the planarization layer 18. Preferably, the pixel definition layer 24 can be located on the transparent conductive layer 23 and on a planarization layer 18 not covered by the transparent conductive layer. Because a periphery of the transparent conductive layer 32 is covered by the pixel definition layer 24, therefore the transparent conductive layer is prevented from separating.

Figure 4:
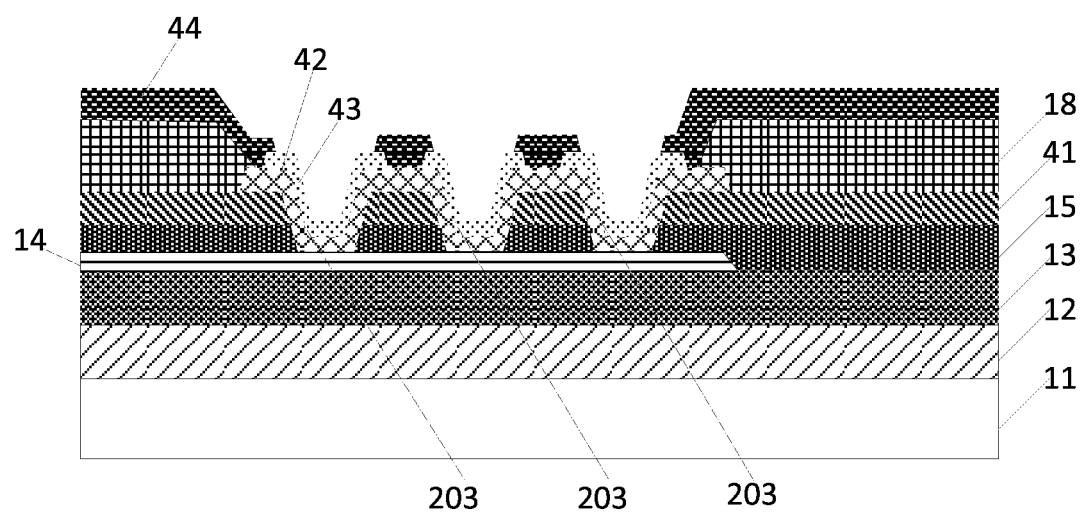
FIG. 4 is a structural schematic view of a third embodiment of the AMOLED display panel of the present invention.

With reference to FIG. 4, FIG. 4 is a structural schematic view of a third embodiment of the AMOLED display panel of the present invention.

As shown in FIG. 4, a structural schematic view of the active matrix organic light-emitting diode display panel in the non-displaying region is given. The active matrix organic light-emitting diode display panel of the present embodiment includes: a substrate 11, a buffer layer 12, a first insulating layer 13, a first metal layer 14, a second insulating layer 15, an interlayer dielectric layer 41, a second metal layer 42, a planarization layer 18, a transparent conductive layer 43 and a pixel definition layer 44.

The buffer layer 12 and the first insulating layer 13 are sequentially located on the substrate 11.

The first metal layer 14 is located on the first insulating layer 13.

The second insulating layer 15 is located on the first metal layer 14.

The interlayer dielectric layer 41 is located on the second insulating layer 15. Three first via holes 203 (not shown in figures) are defined in the interlayer dielectric layer 41. The first metal layer 14 is connected to the second metal layer 42 through the first via holes 203. The first via holes 203 are disposed at intervals. It is understood that a number of the first via holes 203 can be two, three or more.

The second metal layer 42 covers the first via holes and is located on the interlayer dielectric layer 41.

The planarization layer 18 is located on the second metal layer 42. Second via holes (not shown in figures) are defined in the planarization layer 18. The second metal layer 42 is connected to the transparent conductive layer 43 through the second via holes.

The transparent conductive layer 43 covers the second via holes and is located on the planarization layer 18. The transparent conductive layer 43 is located on the second metal layer 42 in the first via holes, and a portion of the transparent conductive layer 43 is located on a portion of the second metal layer 42 located on the interval. A location of a portion of the second metal layer at the interval corresponds to a location of a portion of the interlayer dielectric layer on an adjacent portion between adjacent two of the first via holes. In other words, the portion of the second metal layer 42 at the interval is the portion of the second metal layer on the interlayer dielectric layer 41 on the adjacent portion of adjacent two of the first via holes 203. It is to say that the transparent conductive layer covers a portion of the second metal layer on a protrusion between the two first via holes, and the transparent conductive layer 43 only fully contacts the second metal layer 42 in the first via holes but partially contacts the second metal layer 42 outside the first via holes.

With reference to FIG. 4, it is apparent that a contact surface between the second metal layer 42 and the transparent conductive layer 43 is also a rugged surface, and roughness of the contact surface between the second metal layer 42 and the transparent conductive layer 43 is also increased to prevent the transparent conductive layer from separating and to increase electrical connection stability of the active matrix organic light-emitting diode display panel. Furthermore, corrosion of the metal layer is prevented and lifespan of the display panel is improved.

The pixel definition layer 44 is located on the planarization layer 18. It is understood that the pixel definition layer can only covers the planarization layer 18. Preferably, the pixel definition layer 44 can be located on the transparent conductive layer 43, on the planarization layer 18 not covered by the transparent conductive layer and on the second metal layer 42 not covered by the transparent conductive layer 43. Because a periphery of the transparent conductive layer 43 is covered by the pixel definition layer 44, therefore the transparent conductive layer is prevented from separating.

Figure 5:
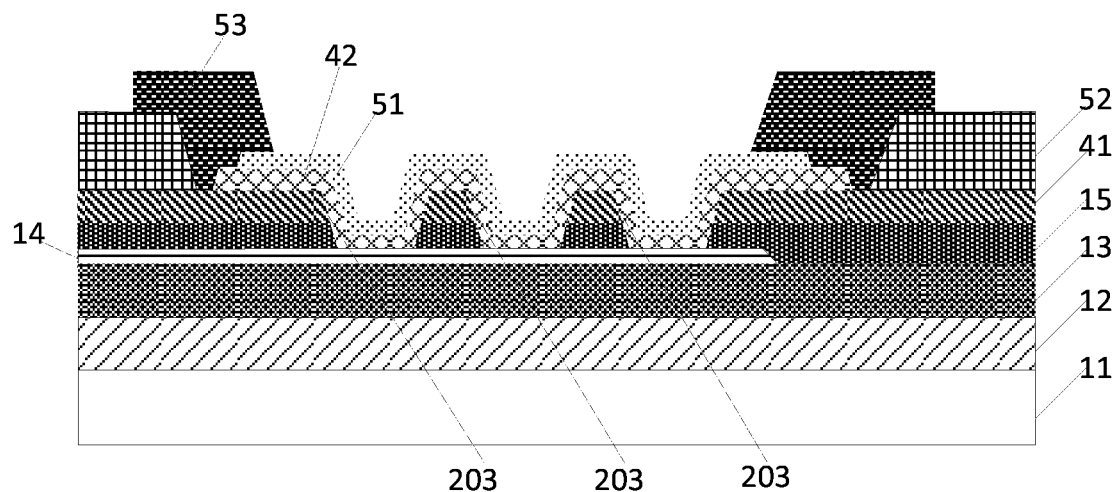
FIG. 5 is a structural schematic view of a fourth embodiment of the AMOLED display panel of the present invention.

With reference to FIG. 5, FIG. 5 is a structural schematic view of a fourth embodiment of the AMOLED display panel of the present invention.

As shown in FIG. 5, a difference of the active matrix organic light-emitting diode display panel of the present embodiment from the third embodiment is that: the transparent conductive layer 51 fully covers the second metal layer 42 at the interval.

The planarization layer 52 is located on the second metal layer 42, but does not cover the second metal layer 42. The planarization layer 52 and the second metal layer 42 are disposed at an interval.

The pixel definition layer 53 is located on the transparent conductive layer 42, on the second metal layer 42 not covered by the planarization layer and on the planarization layer 52.

With reference to FIG. 5, it is apparent that a contact surface between the second metal layer 42 and the transparent conductive layer 51 is also a rugged surface, and roughness of the contact surface between the second metal layer and the transparent conductive layer is also increased to prevent the transparent conductive layer from separating and to increase electrical connection stability of the active matrix organic light-emitting diode display panel. Furthermore, corrosion of the metal layer is prevented and lifespan of the display panel is improved.

It is understood that, the active matrix organic light-emitting diode display panel in the above embodiment can be applied to the IC pad, FPC pad, array full contact testing pad, and cell testing pad in the non-displaying region.

The active matrix organic light-emitting diode display panel of the present invention, by increasing roughness of a contact surface between the second metal layer and the transparent conductive layer, prevents transparent conductive layer from shedding, prevents the metal layer from corrosion, and increases connection stability and lifespan of the display panel.

Although the preferred embodiments of the present invention have been disclosed as above, the aforementioned preferred embodiments are not used to limit the present invention. The person of ordinary skill in the art may make various changes and modifications without departing from the spirit and scope of the present invention. Therefore, the scope of protection of the present invention is defined by the scope of the claims.

What is claimed is:

1. An active matrix organic light-emitting diode display panel, comprising:
    a first metal layer and an interlayer dielectric layer sequentially disposed on a substrate; wherein a first via hole is defined in the interlayer dielectric layer, and the first metal layer is connected to a portion of a second metal layer through the first via hole;
    the second metal layer covering the first via hole;
    a planarization layer located on the second metal layer, and a second via hole defined the planarization layer; and
    a transparent conductive layer covering the second via hole and located on a portion of the planarization layer, the transparent conductive layer connected to the second metal layer through the second via hole; wherein a contact surface of the second metal layer and the transparent conductive layer is a waved surface.

2. The active matrix organic light-emitting diode display panel as claimed in claim 1, wherein
    at least one fourth via hole is defined in the second metal layer, and a portion of the transparent conductive layer is connected to a portion of the first metal layer through the at least one fourth via hole; and
    the transparent conductive layer covers the second via hole and the at least one fourth via hole, and is located on the planarization layer.

3. The active matrix organic light-emitting diode display panel as claimed in claim 1, wherein the active matrix organic light-emitting diode display panel further comprises:
    a buffer layer located between the substrate and the first metal layer;
    a first insulating layer located between the buffer layer and the first metal layer; and
    a second insulating layer located between the first metal layer and the interlayer dielectric layer.

4. The active matrix organic light-emitting diode display panel as claimed in claim 1, wherein the active matrix organic light-emitting diode display panel further comprises:
    a pixel definition layer located on the transparent conductive layer and a portion of the planarization layer not covered by the transparent conductive layer.

5. The active matrix organic light-emitting diode display panel as claimed in claim 1, wherein the active matrix organic light-emitting diode display panel further comprises:
  a first insulating layer located between the substrate and the first metal layer; and
  at least one third via hole defined in the first metal layer, wherein the first insulating layer is connected to a portion of the second metal layer through the at least one third via hole.

6. The active matrix organic light-emitting diode display panel as claimed in claim 5, wherein
  the second metal layer covers the at least one third via hole and the first via hole.

7. The active matrix organic light-emitting diode display panel as claimed in claim 1, wherein
  two or more first via holes are defined in the interlayer dielectric layer at intervals.

8. The active matrix organic light-emitting diode display panel as claimed in claim 7, wherein
  the transparent conductive layer covers a portion of the second metal layer at a corresponding interval, and the portion of the second metal layer at the corresponding interval is the portion of the second metal layer on a portion of the interlayer dielectric layer on an adjacent portion between adjacent two of the first via holes.

9. The active matrix organic light-emitting diode display panel as claimed in claim 7, wherein
  the transparent conductive layer fully covers the second metal layer at a corresponding interval, and the portion of the second metal layer at the corresponding interval is the portion of the second metal layer on a portion of the interlayer dielectric layer on an adjacent portion between adjacent two of the first via holes.

10. The active matrix organic light-emitting diode display panel as claimed in claim 7, wherein
  the pixel definition layer covers the transparent conductive layer, a portion of the second metal layer not covered by the transparent conductive layer and a portion of the planarization layer not covered by the transparent conductive layer.

11. An active matrix organic light-emitting diode display panel, comprising:
  a first metal layer and an interlayer dielectric layer sequentially disposed on a substrate; wherein two or more first via holes are defined in the interlayer dielectric layer at intervals, and the first metal layer is connected to a portion of a second metal layer through the first via holes;
  the second metal layer covering the first via holes;
  a planarization layer located on the second metal layer, and second via holes defined in the planarization layer;
  a transparent conductive layer covering the second via holes and located on a portion of the planarization layer, the transparent conductive layer connected to the second metal layer through the second via holes; wherein a contact surface of the second metal layer and the transparent conductive layer is a waved surface; and
  a pixel definition layer located on the transparent conductive layer and located on a portion of planarization layer that is not covered by the transparent conductive layer.

12. The active matrix organic light-emitting diode display panel as claimed in claim 11, wherein
  at least one fourth via hole is defined in the second metal layer, and a portion of the transparent conductive layer is connected to a portion of the first metal layer through the at least one fourth via hole; and
  the transparent conductive layer covers the second via holes and the at least one fourth via hole, and is located on the planarization layer.

13. The active matrix organic light-emitting diode display panel as claimed in claim 11, wherein the active matrix organic light-emitting diode display panel further comprises:
  a buffer layer located between the substrate and the first metal layer;
  a first insulating layer located between the buffer layer and the first metal layer; and
  a second insulating layer located between the first metal layer and the interlayer dielectric layer.

14. The active matrix organic light-emitting diode display panel as claimed in claim 11, wherein
  the transparent conductive layer covers a portion of the second metal layer at a corresponding interval, and the portion of the second metal layer at the corresponding interval is the portion of the second metal layer on a portion of the interlayer dielectric layer on an adjacent portion between adjacent two of the first via holes.

15. The active matrix organic light-emitting diode display panel as claimed in claim 11, wherein
  the transparent conductive layer fully covers the second metal layer at a corresponding interval, and the portion of the second metal layer at the corresponding interval is the portion of the second metal layer on a portion of the interlayer dielectric layer on an adjacent portion of adjacent two of the first via holes.

16. The active matrix organic light-emitting diode display panel as claimed in claim 11, wherein
  the pixel definition layer covers the transparent conductive layer, a portion of the second metal layer not covered by the transparent conductive layer and a portion of the planarization layer not covered by the transparent conductive layer.

17. The active matrix organic light-emitting diode display panel as claimed in claim 11, wherein
  the active matrix organic light-emitting diode display panel further comprises a first insulating layer located between the substrate and the first metal layer; and
  at least one third via hole is defined in the first metal layer, and the first insulating layer is connected to a portion of the second metal layer through the at least one third via hole.

18. The active matrix organic light-emitting diode display panel as claimed in claim 17, wherein
  the second metal layer covers the at least one third via hole and the first via holes.

* * * * *